United States Patent
Uno et al.

(10) Patent No.: US 7,619,493 B2
(45) Date of Patent: Nov. 17, 2009

(54) BULK ACOUSTIC RESONATOR AND FILTER ELEMENT

(75) Inventors: Takashi Uno, Hyogo (JP); Naohiro Tsurumi, Kyoto (JP); Kazuhiro Yahata, Osaka (JP); Hiroyuki Sakai, Kyoto (JP)

(73) Assignee: Panasonic Corporation, Osaka (JP)

( * ) Notice: Subject to any disclaimer, the term of this patent is extended or adjusted under 35 U.S.C. 154(b) by 280 days.

(21) Appl. No.: 11/590,804

(22) Filed: Nov. 1, 2006

(65) Prior Publication Data

US 2007/0096851 A1    May 3, 2007

(30) Foreign Application Priority Data

Nov. 2, 2005  (JP)  ............... 2005-319079

(51) Int. Cl.
*H03H 9/15* (2006.01)
*H03H 9/54* (2006.01)

(52) U.S. Cl. .................. 333/187; 333/189; 310/335

(58) Field of Classification Search ............. 333/187, 333/189; 310/335
See application file for complete search history.

(56) References Cited

U.S. PATENT DOCUMENTS

| | | | |
|---|---|---|---|
| 5,872,493 A * | 2/1999 | Ella | 333/191 |
| 6,278,342 B1 * | 8/2001 | Ella | 333/189 |
| 6,297,515 B1 * | 10/2001 | Yuan | 257/9 |
| 6,927,649 B2 * | 8/2005 | Metzger et al. | 333/133 |
| 6,985,052 B2 * | 1/2006 | Tikka | 333/189 |
| 6,992,400 B2 * | 1/2006 | Tikka et al. | 257/787 |
| 7,042,090 B2 * | 5/2006 | Noguchi et al. | 257/753 |
| 7,141,913 B2 * | 11/2006 | Shearer et al. | 310/322 |
| 7,378,781 B2 * | 5/2008 | Vilander | 310/343 |
| 2002/0084873 A1 * | 7/2002 | Ella et al. | 333/189 |
| 2004/0189423 A1 * | 9/2004 | Loebl et al. | 333/187 |

FOREIGN PATENT DOCUMENTS

JP    2002-251190 A    9/2002

* cited by examiner

*Primary Examiner*—Barbara Summons
(74) *Attorney, Agent, or Firm*—McDermott Will & Emery LLP

(57) ABSTRACT

A bulk acoustic resonator has an acoustic reflector portion formed on a substrate and including one or more low acoustic impedance layers and one or more high acoustic impedance layers having a higher acoustic impedance than the low acoustic impedance layer which are disposed in stacked relation and an acoustic resonator portion formed on the acoustic reflector portion and having a piezoelectric film. At least one of the low acoustic impedance layers is made of silicon.

9 Claims, 12 Drawing Sheets

BULK ACOUSTIC RESONATOR AND FILTER ELEMENT

CROSS REFERENCE TO RELATED APPLICATIONS

The teachings of Japanese Patent Application JP 2005-319079, filed Nov. 2, 2005, are entirely incorporated herein by reference, inclusive of the claims, specification, and drawings.

BACKGROUND OF THE INVENTION

The present invention relates to a bulk acoustic resonator used as an RF component and to a filter element using the same.

As recent mobile phone terminals have been produced in multi-band configurations, duplexers and inter-stage filters have been required to have lower-loss and steeper attenuation characteristics than were previously required. A FBAR (Film Bulk Acoustic Resonator) is a bulk acoustic resonator utilizing the resonance of an elastic wave along the thickness of a piezoelectric film. A FBAR filter which is comprised of the FBARs connected in a ladder configuration has received attention as a filter capable of achieving low-loss and steep attenuation characteristics.

FIG. 19 is a cross-sectional view of a bulk acoustic resonator used in a conventional FBAR filter (see, e.g., Japanese Laid-Open Patent Publication No. 2002-251190). As shown in FIG. 19, the bulk acoustic resonator comprises: an acoustic reflector portion 104 formed on a substrate 101 made of silicon; and an acoustic resonator portion 108 formed on the acoustic reflector portion 104. The acoustic resonator portion 108 comprises: an upper electrode 107; a piezoelectric film 106; and a lower electrode 105 which are successively stacked in layers.

The acoustic reflector portion 104 typically comprises: low acoustic impedance layers 103 each having a thickness corresponding to a quarter of the resonance wavelength; and high impedance layers 102 each having a thickness corresponding to a quarter of the resonance wavelength and a higher acoustic impedance than a low acoustic impedance material, which are alternately stacked. The acoustic reflection characteristics are determined by the ratio of the acoustic impedance value (hereinafter referred to as the "acoustic impedance ratio") of each of the high acoustic impedance layers to that of each of the low acoustic impedance layers. The acoustic reflection characteristics are improved by increasing the number of the low acoustic impedance layers 103 and the high acoustic impedance layers 102 which are alternately stacked. Thus, a bulk acoustic resonator with a reduced propagation loss can be achieved by pairing up materials having a high acoustic impedance ratio therebetween or by stacking a larger number of pairs.

In view of this, it has been general practice to use silicon dioxide having as a relatively low acoustic impedance value for the low acoustic impedance layers and use a metal material having an extremely high acoustic impedance value, such as tungsten or molybdenum, for the high acoustic impedance layers.

However, the bulk acoustic resonator comprising the conventional acoustic reflector portion which uses silicon dioxide for the low acoustic impedance layers and uses a metal material for the high acoustic impedance layers has the following problems.

First, a material that can be used for the high acoustic impedance layers is substantially limited to tungsten, molybdenum, or the like because silicon dioxide, which is the material of the low acoustic impedance layers, does have an acoustic impedance of about $1.3 \times 10^7$ kg/s·m$^2$, though it is considerably low. In addition, when tungsten is used to form the high acoustic impedance layers, it is necessary to stack at least four low acoustic impedance layers and at least four high acoustic impedance layers.

The acoustic reflectivity of the acoustic reflector portion lowers as the acoustic impedance ratio is lower. Accordingly, when materials having a low acoustic impedance ratio therebetween are used for the low acoustic impedance layers and for the high acoustic impedance layers, it is necessary to increase the number of the low acoustic impedance layers and the high acoustic impedance layers which are alternately stacked.

However, when the number of the low acoustic impedance layers and the high acoustic impedance layers which are alternately stacked is increased, the number of process steps and fabrication cost are also increased undesirably. In addition, when the number of the stacked layers is increased, the upper surface of the acoustic reflector portion is rough, which leads to the problem of poor crystallinity of the piezoelectric film of the acoustic resonator portion formed on the acoustic reflector portion.

In the case where the acoustic reflector portion is formed by using insulating silicon dioxide for the low acoustic impedance layers and a conductive metal material for the high acoustic impedance layers, an electrical leakage path may be formed disadvantageously by capacitance components and resistance components produced in the acoustic reflector portion. When the electrical leakage path is formed, the problem is encountered that signal leakage occurs between the individual acoustic resonator portions formed in adjacent relation on the acoustic reflector portion and causes the occurrence of a signal loss.

SUMMARY OF THE INVENTION

It is therefore an object of the present invention to solve the conventional problems described above and implement a bulk acoustic resonator having an acoustic reflector portion comprised of a small number of stacked layers.

Specifically, a bulk acoustic resonator according to the present invention comprises: an acoustic reflector portion formed on a substrate and including one or more low acoustic impedance layers and one or more high acoustic impedance layers having a higher acoustic impedance than the low acoustic impedance layer which are disposed in stacked relation; and an acoustic resonator portion formed on the acoustic reflector portion and having a piezoelectric film, wherein at least one of the low acoustic layers is made of silicon.

Since the bulk acoustic resonator according to the present invention uses, for the low acoustic impedance layer, silicon having an acoustic impedance value of not more than half the acoustic impedance value of silicon dioxide, the acoustic impedance ratio can be increased to a value higher than obtained in the conventional embodiment. This can improve the acoustic reflection characteristics of the acoustic reflector portion, reduce the number of stacked layers in the acoustic reflector portion, and provide a bulk acoustic resonator having excellent characteristics.

In the bulk acoustic resonator according to the present invention, the high acoustic impedance layer is preferably made of a metal and the low acoustic impedance layer made of silicon preferably has an increased resistance. The arrangement can implement a bulk acoustic resonator having extremely excellent acoustic reflection characteristics.

In the bulk acoustic resonator according to the present invention, the high acoustic impedance layer is preferably made of an insulating material. The arrangement can suppress electrical coupling between the individual acoustic resonator portions.

In the bulk acoustic resonator according to the present invention, each of the number of the low acoustic impedance layers and the number of the high acoustic impedance layers is preferably 3 or less. The arrangement can simplify the manufacturing process and also improve the quality of the piezoelectric film.

In the bulk acoustic resonator according to the present invention, at least one of the low acoustic impedance layers made of silicon may be doped with an impurity or porosified. Alternatively, at least one of the low acoustic impedance layers made of silicon may be made of amorphous silicon. The arrangement can increase the resistance of the low acoustic impedance layer and suppress the formation of an electrical leakage path.

Preferably, the bulk acoustic resonator according to the present invention further comprises: a first buffer layer formed between the substrate and the acoustic reflector portion. The arrangement can suppress the warpage of the substrate or film delamination due to a film stress.

Preferably, the bulk acoustic resonator according to the present invention further comprises: a second buffer layer formed between the acoustic reflector portion and the acoustic resonator portion. In this case, the second buffer layer is preferably made of aluminum nitride, titanium, ruthenium, or iridium of which a crystal is C-axis oriented.

In the bulk acoustic resonator according to the present invention, an uppermost layer of the acoustic reflector portion is preferably the low acoustic impedance layer made of silicon having at least a part thereof increased in resistance. The arrangement can reduce the most predominant electrical leakage path component between the acoustic resonator portions. In this case, the silicon having at least a part thereof increased in resistance may be selectively porosified silicon or silicon selectively doped with an impurity.

In the bulk acoustic resonator according to the present invention, an uppermost layer of the acoustic reflector portion is preferably the low acoustic impedance layer made of selectively insulated silicon.

A first filter element according to the present invention comprises: an acoustic reflector portion formed on a substrate and having a low acoustic impedance layer including at least one layer made of silicon and a high acoustic impedance layer having a higher acoustic impedance than the low acoustic impedance layer; and a plurality of acoustic resonator portions each formed on the acoustic reflector portion and having a lower electrode, a piezoelectric film, and an upper electrode which are formed successively in an ascending order, wherein at least two of said plurality of acoustic resonator portions have the respective lower electrodes independent of each other and a resistance value between the independent lower electrodes is not less than 500 Ω.

The first filter element can suppress electrical coupling between the individual acoustic resonator portions via the acoustic reflector portion. As a result, it becomes possible to implement a filter with a small signal loss.

A second filter element according to the present invention comprises: an acoustic reflector portion formed on a substrate and having a low acoustic impedance layer including at least one layer made of silicon and a high acoustic impedance layer having a higher acoustic impedance than the low acoustic impedance layer; a plurality of acoustic resonator portions each formed on the acoustic reflector portion and having a lower electrode, a piezoelectric film, and an upper electrode which are formed successively in an ascending order; and at least three external connection terminals, wherein the external connection terminals are electrically connected to the upper electrodes.

The second filter element eliminates a process for contracting the lower electrode of the acoustic resonator portion so that an improved yield is expected.

The bulk acoustic resonator according to the present invention can implement a bulk acoustic resonator having an acoustic reflector portion comprised of a small number of stacked layers. This allows a high-performance filter element to be implemented.

BRIEF DESCRIPTION OF THE DRAWINGS

FIGS. 2A and 2B show the characteristics of the bulk acoustic resonator according to the first embodiment, of which FIG. 2A is a graph showing the characteristics when silicon is used for low acoustic impedance layers and FIG. 2B is a graph showing the characteristics when silicon dioxide is used for the low acoustic impedance layers;

DETAILED DESCRIPTION OF THE INVENTION

Embodiment 1

Figure 1:
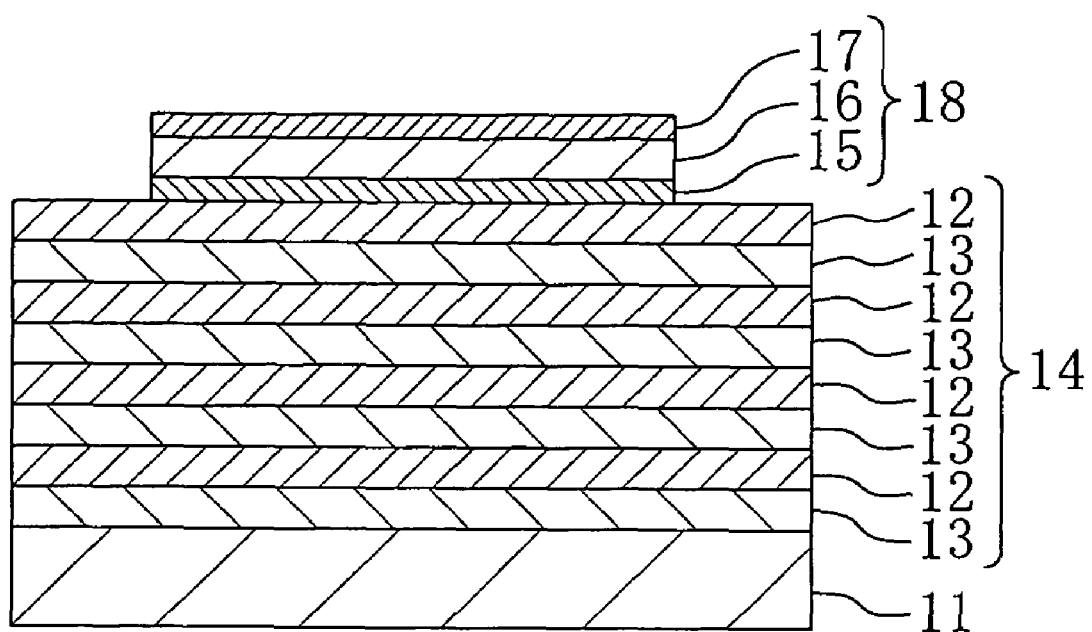
FIG. 1 is a cross-sectional view showing a bulk acoustic resonator according to a first embodiment of the present invention.

A first embodiment of the present invention will be described with reference to the drawings. FIG. 1 shows the cross-sectional structure of a bulk acoustic resonator according to the first embodiment. As shown in FIG. 1, the bulk acoustic resonator comprises: an acoustic reflector portion 14 formed on a substrate 11 made of silicon; and an acoustic resonator portion 18 formed on the acoustic reflector portion 14. Although the acoustic resonator portion 18 provided in the case shown in FIG. 1 is only one, the two or more acoustic resonator portions 18 may also be provided.

The acoustic reflector portion 14 is comprised of low acoustic impedance layers 12 and high acoustic impedance layers 13 which are alternately formed. In the present embodiment, the low acoustic impedance layers 12 are made of silicon and the high acoustic impedance layers 13 are made of a metal material having an extremely high acoustic impedance value, such as tungsten or molybdenum.

Since silicon is a conductive material, it has not been used for the low acoustic impedance layers. However, silicon has an extremely low acoustic impedance value of half the acoustic impedance value of silicon dioxide or less so that it is extremely suitable as the low acoustic impedance material of the acoustic reflector portion. When silicon is used for the low acoustic impedance layers 12, the acoustic impedance ratio is increased so that the acoustic reflection characteristics of the acoustic reflector portion 14 are improved.

Figure 2A:
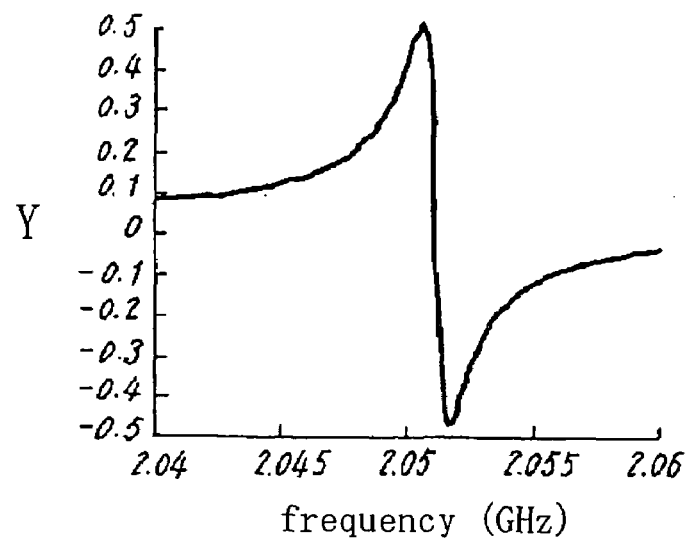
Figure 2B:
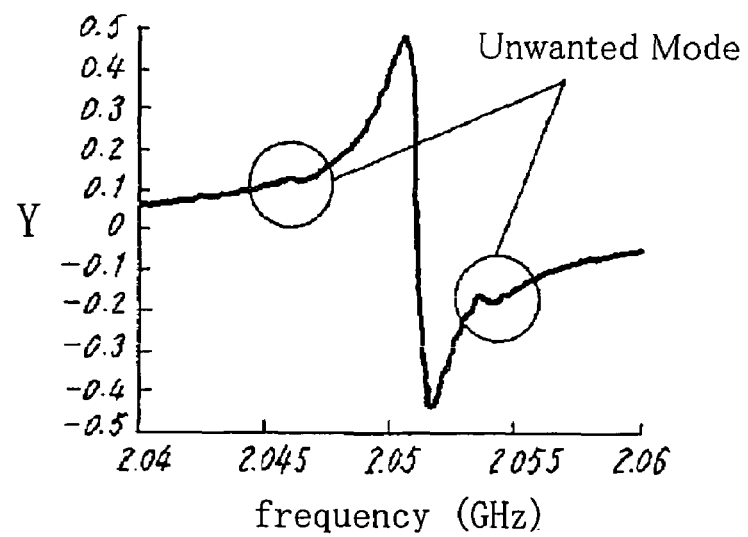

FIGS. 2A and 2B show the results of simulating the acoustic reflection characteristics of the bulk acoustic resonator according to the first embodiment, of which FIG. 2A shows the result when silicon is used for the low acoustic impedance layers and FIG. 2B shows the result when silicon dioxide is used for the low acoustic impedance layers. In each of FIGS. 2A and 2B, the abscissa axis represents a frequency and the ordinate axis represents an admittance.

The resonance frequency of the bulk acoustic resonator used for simulation was assumed to be 2 GHz and the film thickness of each of the low acoustic impedance layers and the high acoustic impedance layers was assumed to be a quarter of the wavelength of an acoustic wave at the resonance frequency. For example, the film thickness of each of the low acoustic impedance layers made of silicon was assumed to be 260 nm and the film thickness of each of the high acoustic impedance layers made of tungsten was assumed to be 600 nm. It was also assumed that three low acoustic impedance layers and three high acoustic impedance layers were alternately stacked.

The acoustic resonator portions having the same resonance characteristics were formed on the acoustic reflector portion and the respective reflection characteristics of acoustic waves generated from the acoustic resonator portions were compared with each other. In each of the acoustic resonator portions, the thickness of each of the upper and lower electrodes made of molybdenum and the piezoelectric film made of aluminum nitride was assumed to be 500 nm such that it was half the acoustic resonance frequency (2 GHz).

When the reflectivity of an acoustic wave in the acoustic reflector portion is insufficient, the acoustic wave generated in any of the acoustic resonator portions partly passes through the acoustic reflector portion and reaches the substrate. The acoustic wave that has reached the substrate is partly reflected at the upper surface or the lower surface of the substrate and returns to the acoustic reflector portion. However, since the substrate has an extremely large thickness and has not been adjusted to serve as a reflecting layer, the phase of the acoustic wave reflected by the substrate does not match the phase of the acoustic wave reflected by the acoustic reflector portion. The mismatch between the phases appears as a spurious mode and degrades the resonance characteristics.

As shown in FIG. 2B, spurious modes have occurred in the conventional acoustic resonator and it is obvious that the acoustic reflectivity of the acoustic reflector portion is insufficient. By contrast, a spurious mode has not occurred in the acoustic resonator according to the present embodiment, as shown in FIG. 2A. Therefore, it is obvious that, by stacking the three high acoustic impedance layers and the three low acoustic impedance layers, the acoustic reflector portion having a sufficient acoustic reflectivity can be achieved.

By thus using silicon for the low acoustic impedance layers, it is possible to implement an acoustic reflector portion having more excellent acoustic reflection characteristics with a smaller number of stacked layers than in the case where silicon dioxide is used to form the low acoustic impedance layers. By reducing the number of the low acoustic impedance layers and the high acoustic impedance layers which are alternately stacked in the acoustic reflector portion, the manufacturing process is facilitated and fabrication cost can be reduced. In addition, it becomes possible to reduce the occurrence of roughness at the surface of the acoustic reflector portion and improve the characteristics of the piezoelectric film formed on the acoustic reflector portion.

Table 1 shows the acoustic impedance values of materials used frequently for a semiconductor process. As shown in Table 1, the acoustic impedance value of silicon is half the acoustic impedance value of silicon dioxide used for the conventional low acoustic impedance layers or less. Therefore, it can be considered that, by using silicon for the low acoustic impedance layers, an acoustic reflector portion having excellent acoustic reflection characteristics can be implemented not only when a metal material is used for the high acoustic impedance layers but also when an insulating material is used for the high acoustic impedance layers.

TABLE 1

| Name of Material | Acoustic Impedance [Kg/s · m$^2$] |
| --- | --- |
| Silicon | $5.060 \times 10^6$ |
| Silicon Dioxide | $1.284 \times 10^7$ |
| Aluminum | $1.377 \times 10^7$ |
| Titanium | $1.866 \times 10^7$ |
| Silicon Nitride | $2.806 \times 10^7$ |
| Magnesium Oxide | $3.240 \times 10^7$ |
| Gold | $3.358 \times 10^7$ |
| Aluminum Nitride | $3.543 \times 10^7$ |
| Hafnium Oxide | $4.941 \times 10^7$ |
| Platinum | $5.652 \times 10^7$ |
| Molybdenum | $6.363 \times 10^7$ |
| Tungsten | $9.960 \times 10^7$ |
| Iridium | $1.093 \times 10^8$ |

For example, when silicon dioxide is used for the low acoustic impedance layers and hafnium oxide is used for the high acoustic impedance layers, the acoustic impedance ratio therebetween is 3.9. Therefore, it is necessary to greatly increase the number of the low acoustic impedance layers and the high acoustic impedance layers which are alternately stacked compared with the case where tungsten is used for the high acoustic impedance layers. By contrast, when silicon is used for the low acoustic impedance layers and hafnium oxide is used for the high acoustic impedance layers, the acoustic impedance ratio therebetween is 9.8. This value is higher than 7.8, which is the acoustic impedance ratio when silicon dioxide and tungsten are used in combination. When silicon and hafnium oxide are used in combination, an acoustic reflector portion having a sufficient acoustic reflectivity can be implemented even when each of the number of the high acoustic impedance layers and the number of the low acoustic impedance layers which are alternately stacked is reduced to 3 or less. Instead of hafnium oxide ($HfO_2$), hafnium oxynitride ($HfO_{2-X}N_X(0<X<2)$) or magnesium oxide (MgO) may also be used for the high acoustic impedance layers 13.

By reducing the number of the low acoustic impedance layers and the high acoustic impedance layers which are alternately stacked, the roughness of the upper surface of the acoustic reflector portion can be reduced so that an improved yield is expected.

The acoustic reflection characteristics of the acoustic reflector portion are improved not only when all the low acoustic impedance layers are made of silicon but also when only one of the low acoustic impedance layers is made of silicon.

When the acoustic reflector portion is produced by a deposition method of which the film stress is difficult to control, such as electron beam evaporation, the film stress of the acoustic reflector portion may be increased undesirably. When film delamination, the warping of the substrate, and the like occur under the film stress, the subsequent fabrication steps become difficult.

Figure 3:
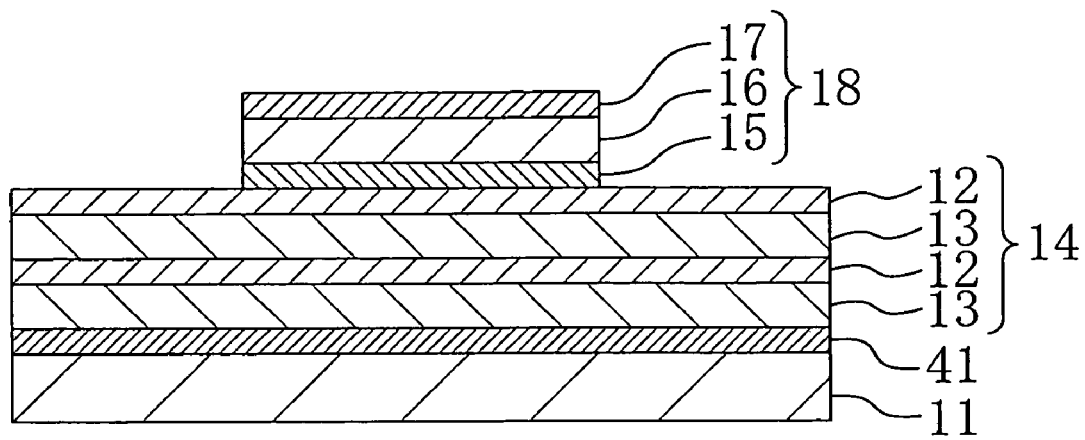
FIG. 3 is a cross-sectional view showing a bulk acoustic resonator according to a variation of the first embodiment.

To reduce the film stress of the acoustic reflector portion, it is also possible to provide a buffer layer 41 between the substrate 11 and the acoustic reflector portion 14, as shown in FIG. 3.

Preferably, the buffer layer 41 is selectively determined to reduce the warping of the substrate 11 caused by the film stress of the acoustic reflector portion 14. For example, when the acoustic reflector portion 14 has a compressive stress against the substrate 11, a film having a tensile stress against the substrate 11 is preferably used as the buffer layer 41. It is also possible to use a flexible film such as that made of titanium or the like. By using titanium to form the buffer layer 41, it becomes possible to reduce or compensate for the difference between the respective expansion coefficients of the acoustic reflector portion 14 and the substrate 11 or the like, which causes the stress, and thereby suppress the film delamination and the warping of the substrate. Even when an amorphous film made of silicon dioxide or the like is used, the stress of the acoustic reflector portion 14 can be reduced by the same effect as achieved when titanium is used.

Figure 4:
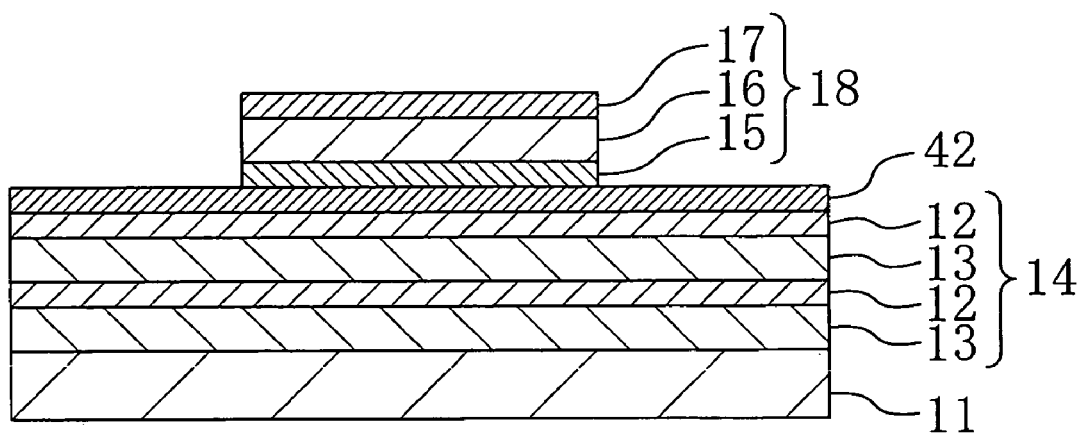
FIG. 4 is a cross-sectional view showing a bulk acoustic resonator according to another variation of the first embodiment.

As shown in FIG. 4, it is also possible to provide a buffer layer 42 for reducing the stress between the acoustic reflector portion 14 and the acoustic resonator portion 18. For the buffer layer 42 between the acoustic reflector portion 14 and the acoustic resonator portion 18, it is preferable to use aluminum nitride, titanium, ruthenium, iridium, or the like which is C-axis oriented. This intensifies the C-axis orientation of each of the lower and upper electrodes 15 and 17 of the acoustic resonator portion 18 and the piezoelectric film 16 made of zinc oxide, aluminum nitride, or the like and allows excellent resonance characteristics to be obtained.

Embodiment 2

Figure 5:
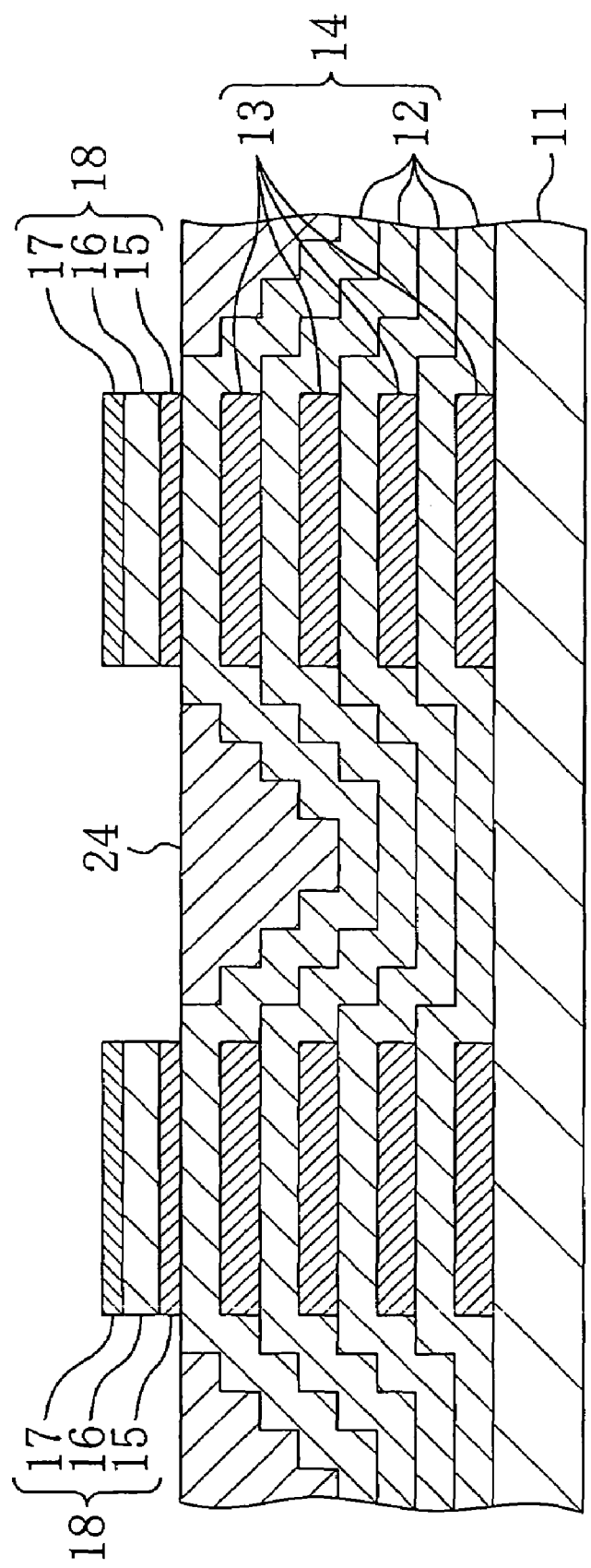
FIG. 5 is a cross-sectional view showing a bulk acoustic resonator according to a second embodiment of the present invention.

A second embodiment of the present invention will be described with reference to the drawings. FIG. 5 shows the cross-sectional structure of a bulk acoustic resonator according to the second embodiment. As shown in FIG. 5, the bulk acoustic resonator according to the second embodiment has two acoustic resonator portions 18 formed on an acoustic reflector portion 14. The bulk acoustic resonator according to the present embodiment is characterized in that the acoustic reflector portion 14 is comprised of low acoustic impedance layers 12 made of silicon and high acoustic impedance layers 13 made of tungsten or the like and the high acoustic impedance layers 13 are provided individually and independently for each of the acoustic resonator portion 18. Although the two acoustic resonator portions 18 are provided in the example shown in FIG. 5, the number of the acoustic resonator portions 18 may be changed arbitrarily.

Figure 6:
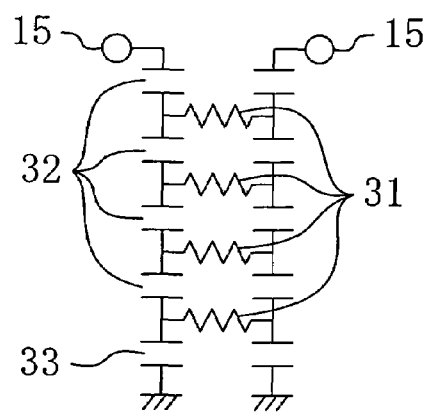
FIG. 6 is an equivalent circuit diagram showing an electrical leakage path circuit formed between the two adjacent acoustic resonator portions.

When a metal film made of tungsten or the like is used for the high acoustic impedance layers 13, an electrical leakage path circuit as shown in FIG. 6 is formed undesirably by resistance components 31 formed between the respective lower electrodes 15 of the adjacent acoustic resonator portions 18, capacitance components 32 formed between each of the lower electrodes 15 and the high acoustic impedance layers 15 and between the individual high acoustic impedance layers, and capacitance components 33 formed between the high acoustic impedance layers 13 and the substrate 11.

Since the circuit shown in FIG. 6 has characteristics close to those of a high-pass filter, the adjacent acoustic resonator portions 18 are electrically coupled to each other in a band of not less than 1 GHz, thereby increasing an insertion loss and degrading the attenuation characteristics.

To prevent these, in the bulk acoustic resonator according to the present embodiment, the portions of the conductive high acoustic impedance layers 13 which are located between the two adjacent acoustic resonator portions 18 are removed and the resistance of each of the low acoustic impedance layers 12 made of silicon is increased.

The resistance of each of the low acoustic impedance layers 12 may be increased appropriately by, e.g., a method using the silicon film, which is thermally annealed at a temperature of 400° C. to 600° C. to diffuse gold or the like into the silicon film, as the low acoustic impedance layer 12, a method which deposits the silicon film and then implants hydrogen ions or the like into the silicon film, a method which deposits the silicon film and then porosifies it by using a solution mixture of hydrogen fluoride and ethanol, or the like. Instead of depositing the silicon film and then increasing the resistance thereof, it is also possible to deposit amorphous silicon for the low acoustic impedance layer 12 by low-temperature chemical vapor deposition (CVD), electron beam evaporation, or the like. Amorphous silicon has a more excellent insulating property than crystallized silicon and can suppress electrical coupling between the adjacent acoustic resonator portions. In addition, the step of increasing the resistance of each of the low acoustic impedance layers 12 becomes unnecessary and fabrication cost can be reduced.

In general, the resonance characteristics of each of the acoustic resonator portions 18 are determined by the orientation of the piezoelectric film 16, which can be improved by depositing the piezoelectric film 16 on a surface with reduced roughness. Therefore, in the bulk acoustic resonator according to the present embodiment, the upper surface of the acoustic reflector portion 14 is planarized by burying an oxide film 24 in the stepped portion or the depressed portion which has been formed between the adjacent acoustic resonator portions 18 by partially removing the high acoustic impedance layers 13.

Instead of tungsten, another metal material having a high acoustic impedance may also be used for the high acoustic impedance layers 13. For example, the acoustic impedance ratio between silicon and iridium is 21.6 and higher than 19.7, which is the acoustic impedance ratio when tungsten is used.

Embodiment 3

Figure 7:
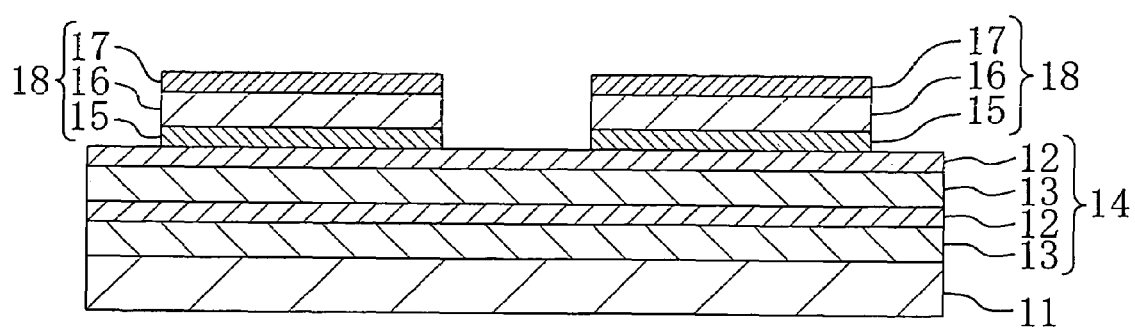
FIG. 7 is a cross-sectional view showing a bulk acoustic resonator according to a third embodiment of the present invention.

A third embodiment of the present invention will be described with reference to the drawings. FIG. 7 shows the cross-sectional structure of a bulk acoustic resonator according to the third embodiment. As shown in FIG. 7, the bulk acoustic resonator comprises: an acoustic reflector portion 14 formed on a substrate 11 made of silicon and two acoustic resonator portions 18 formed on the acoustic reflector portion 14. Although the two acoustic resonator portions 18 are provided in the example shown in FIG. 7, the number of the acoustic resonator portions 18 may be changed arbitrarily.

The acoustic reflector portion 14 is comprised of two low acoustic impedance layers 12 made of silicon and two insulating high acoustic impedance layers 13 made of hafnium oxide which are alternately stacked. To set the resonance frequency of the bulk acoustic resonator to 2 GHz, the present embodiment has set the film thickness of each of the low acoustic impedance layers 12 to 260 nm and set the film thickness of each of the high acoustic impedance layers 13 to 560 nm.

The resistance of silicon used for the low acoustic impedance layers 12 is increased by the implantation of an impurity therein, porosification, or the like. The low acoustic impedance layers 12 may also be insulated by using amorphous silicon.

Because silicon is a conductive material, the use thereof has not been examined conventionally. However, silicon has an extremely low acoustic impedance value and is therefore extremely suitable as the low acoustic impedance material of the acoustic reflector portion. Accordingly, even when an insulating film made of hafnium oxide or the like is used for the high acoustic impedance layers 13 instead of a film made of tungsten having an extremely high acoustic impedance value, the acoustic impedance ratio is 9.8 so that the acoustic reflector portion having a high acoustic reflectivity is implementable.

By increasing the resistance of each of the low acoustic impedance layers made of silicon, the acoustic reflector portion 14 substantially becomes an insulator. As a result, when the plurality of acoustic resonator portions are formed on the acoustic reflector portion, electrical coupling between the adjacent acoustic resonator portions can be suppressed without patterning the acoustic reflector portion. To form the high acoustic impedance layers 13, hafnium oxynitride ($HfO_{2-X}N_X$ ($0<X<2$)) or magnesium oxide (MgO) may also be used instead of hafnium oxide ($HfO_2$).

Figure 8:
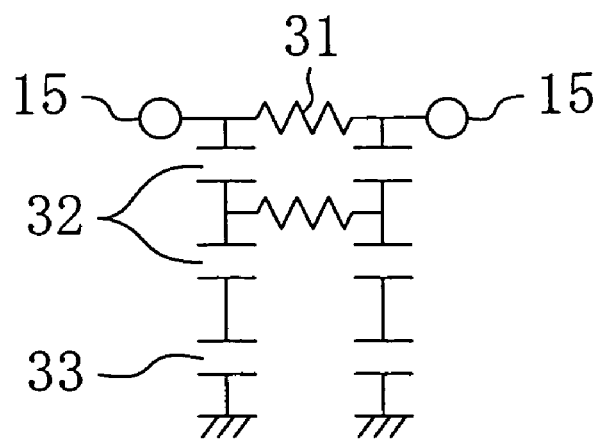
FIG. 8 is an equivalent circuit diagram showing an electrical leakage path circuit formed between the two adjacent acoustic resonator portions in the bulk acoustic resonator according to the third embodiment.

FIG. 8 shows an electrical leakage path circuit formed between the two acoustic resonator portions in the bulk acoustic resonator according to the third embodiment. In the present embodiment, the low acoustic impedance layers 12 are made of silicon and the high acoustic impedance layers 13 are made of an insulating material. Accordingly, the acoustic reflector portion 14 is substantially insulating so that the influence of the resistance components 31 and the capacitance components 32 is reduced.

Figure 9:
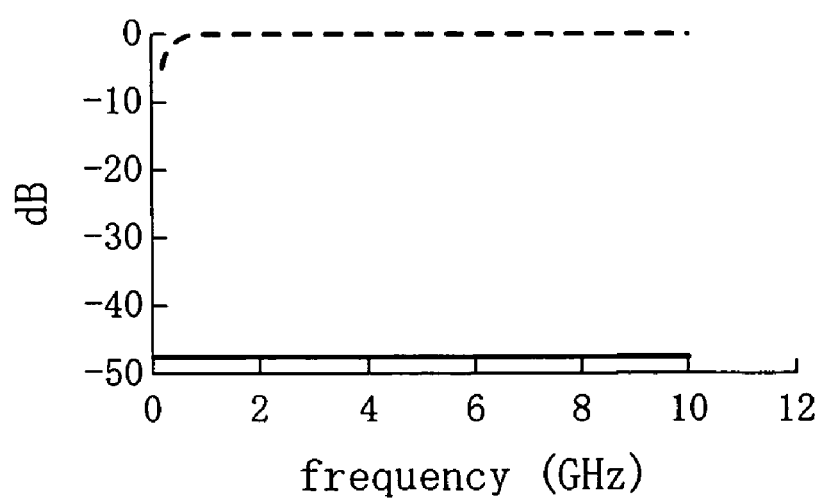
FIG. 9 is a graph showing the leakage characteristic of the bulk acoustic resonator according to the third embodiment.

FIG. 9 shows the result of evaluating the characteristic of the electrical leakage path component shown in FIG. 8 by simulation. In FIG. 9, the abscissa axis represents a frequency and the ordinate axis represents the attenuation factor of a signal. FIG. 9 shows that, as a value indicated by the ordinate axis is closer to zero, the signal is more likely to be transmitted and the electrical coupling between the adjacent acoustic resonator portions is stronger.

As indicated by the broken line in FIG. 9, when silicon dioxide is used for the low acoustic impedance layers and tungsten is used for the high acoustic impedance layers, the signal hardly attenuates between the adjacent acoustic resonator portions under the influence of the electrical leakage path component and the electrical coupling between the adjacent acoustic resonator portions is obvious. By contrast, as indicated by the solid line in FIG. 9, the signal greatly attenuates between the adjacent resonator portions in the bulk acoustic resonator according to the present embodiment and it is evident that electrical coupling between the adjacent resonator portions has been suppressed.

Even when only the low acoustic impedance layer 12 as the uppermost layer of the acoustic reflector portion is formed of silicon with an increased resistance or of amorphous silicon, the electrical leakage path component can be reduced so that the effect of suppressing electrical coupling between the adjacent acoustic resonator portions is obtainable.

Since each of amorphous silicon, hafnium oxide, and hafnium oxynitride can be deposited by electron beam evaporation or the like and therefore can be continuously grown in the same chamber, fabrication cost can be suppressed.

By reducing the number of the low acoustic impedance layers and the high acoustic impedance layers which are alternately stacked, the electrical leakage path component resulting from the resistance component 31, the capacitance component 32, and the like can be reduced and therefore electrical coupling between the adjacent acoustic resonator portions can be efficiently suppressed. In addition, since the roughness of the upper surface of the acoustic reflector portion can be reduced, an improved yield can be expected.

Not only when all the low acoustic impedance layers are formed of silicon but also when any one of the low acoustic impedance layers is formed of silicon, an acoustic reflector portion having a sufficient acoustic reflectivity can be implemented by using hafnium oxide for the high acoustic impedance layers and reducing each of the number of the low acoustic impedance layers and the number of the high acoustic impedance layers to 3 or less.

Embodiment 4

Figure 10:
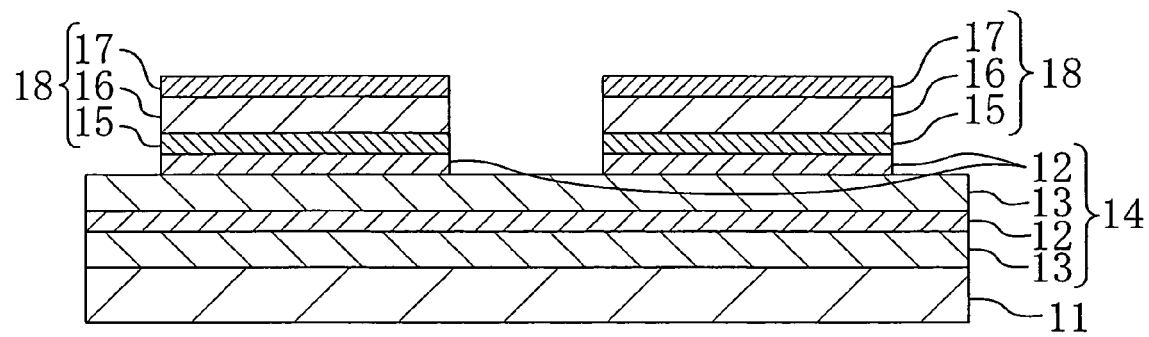
FIG. 10 is a cross-sectional view showing a bulk acoustic resonator according to a fourth embodiment of the present invention.

A fourth embodiment of the present invention will be described with reference to the drawings. FIG. 10 shows the cross-sectional view structure of a bulk acoustic resonator according to the fourth embodiment. The description of the components shown in FIG. 10 which are the same as those shown in FIG. 7 will be omitted by retaining the same reference numerals. The bulk acoustic resonator according to the fourth embodiment is characterized in that the low acoustic impedance layer 12 provided as the uppermost layer of the acoustic reflector portion 14 is removed in the region between the two adjacent acoustic resonator portions 18.

Figure 11:
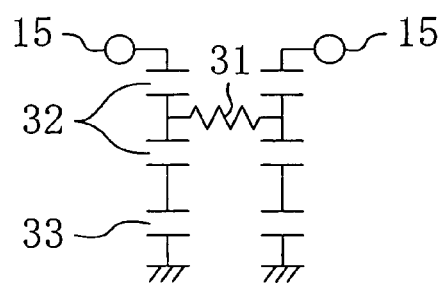
FIG. 11 is an equivalent circuit diagram showing an electrical leakage path circuit formed between the two adjacent acoustic resonator portions in the bulk acoustic resonator according to the fourth embodiment.

In the arrangement, there is no more influence of the resistance components 31 resulting from the low acoustic impedance layer 12 as the uppermost layer of the acoustic reflector portion 14 so that the electrical leakage path component in the bulk acoustic resonator according to the present embodiment is equal to a circuit as shown in FIG. 11. As shown in FIG. 8, the resistance components 31 resulting from the low acoustic impedance layer 12 as the uppermost layer of the acoustic reflector portion 14 in the bulk acoustic resonator according to the third embodiment are most predominant electrical leakage path components. Therefore, the bulk acoustic resonator according to the present embodiment which is free from the influence of the resistance components 31 resulting from the low acoustic impedance layer 12 as the uppermost layer of the acoustic reflector portion 14 can more efficiently suppress electrical coupling between the two adjacent acoustic resonator portions 18.

Figure 12:
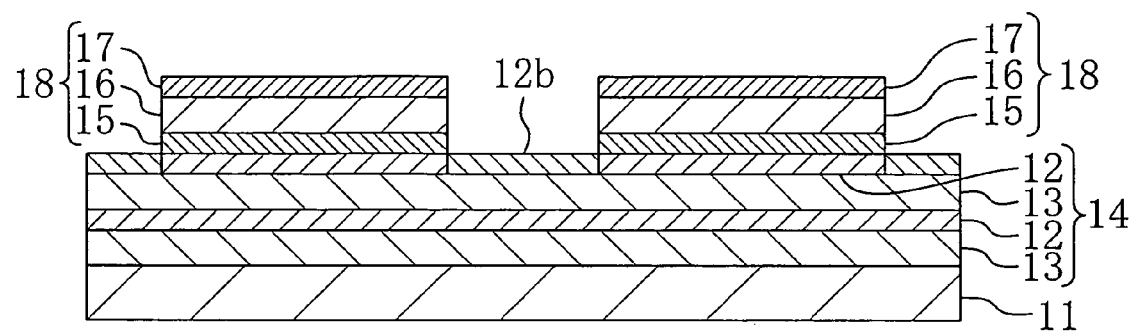
FIG. 12 is a cross-sectional view showing a bulk acoustic resonator according to a variation of the fourth embodiment.

Instead of removing the low acoustic impedance layer 12 as the uppermost layer of the acoustic reflector portion 14 in the region between the adjacent acoustic resonator portions 18, it is also possible to form a silicon dioxide layer 12b by selectively oxidizing the low acoustic impedance layer 12, as shown in FIG. 12. In this case also, the same effect as obtained when the low acoustic impedance layer 12 as the uppermost layer of the acoustic reflector portion 14 is removed in the region between the adjacent acoustic resonator portions 18 can be obtained. In addition, since the roughness of the upper surface of the acoustic reflector portion is reduced, the quality of the piezoelectric film 16 or the like is improved and the characteristics of the bulk acoustic resonator can be improved. The silicon dioxide layer 12b may be formed appropriately by thermal oxidation, plasma oxidation, or the like. Instead, a silicon nitride film may also be formed by processing the low acoustic impedance layer 12 with a nitrogen plasma. Otherwise, the resistance of the low acoustic impedance layer 12 may also be increased by partially doping it with an impurity or porosification thereof.

The partial oxidation, nitridation, and resistance increase described above can also achieve the effect of suppressing electrical coupling between the adjacent acoustic resonator portions even when it is performed with respect to a silicon layer which is the low acoustic impedance layer other than the uppermost layer.

Embodiment 5

Figure 13:
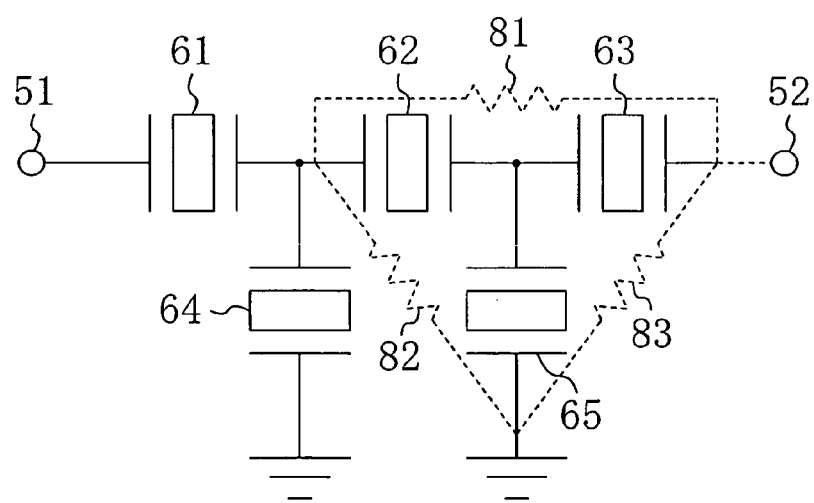
FIG. 13 is an equivalent circuit diagram showing a filter according to a fifth embodiment of the present invention.

A fifth embodiment of the present invention will be described with reference to the drawings. FIG. 13 shows the circuit structure of a filter element according to the fifth embodiment. As shown in FIG. 13, the filter element according to the fifth embodiment includes a plurality of bulk acoustic resonators which are arranged in a ladder configuration. Between a first I/O terminal 51 and a second I/O terminals 52, a first series bulk acoustic resonator 61, a second series bulk acoustic resonator 62, and a third series bulk acoustic resonator 63 are connected in series. Between the ground and the connection node between the first and second series bulk acoustic resonators 61 and 62, a first parallel bulk acoustic resonator 64 is connected. Between the ground and the connection node between the second and third series bulk acoustic resonators 62 and 63, a second parallel bulk acoustic resonator 65 is connected.

Figure 14:
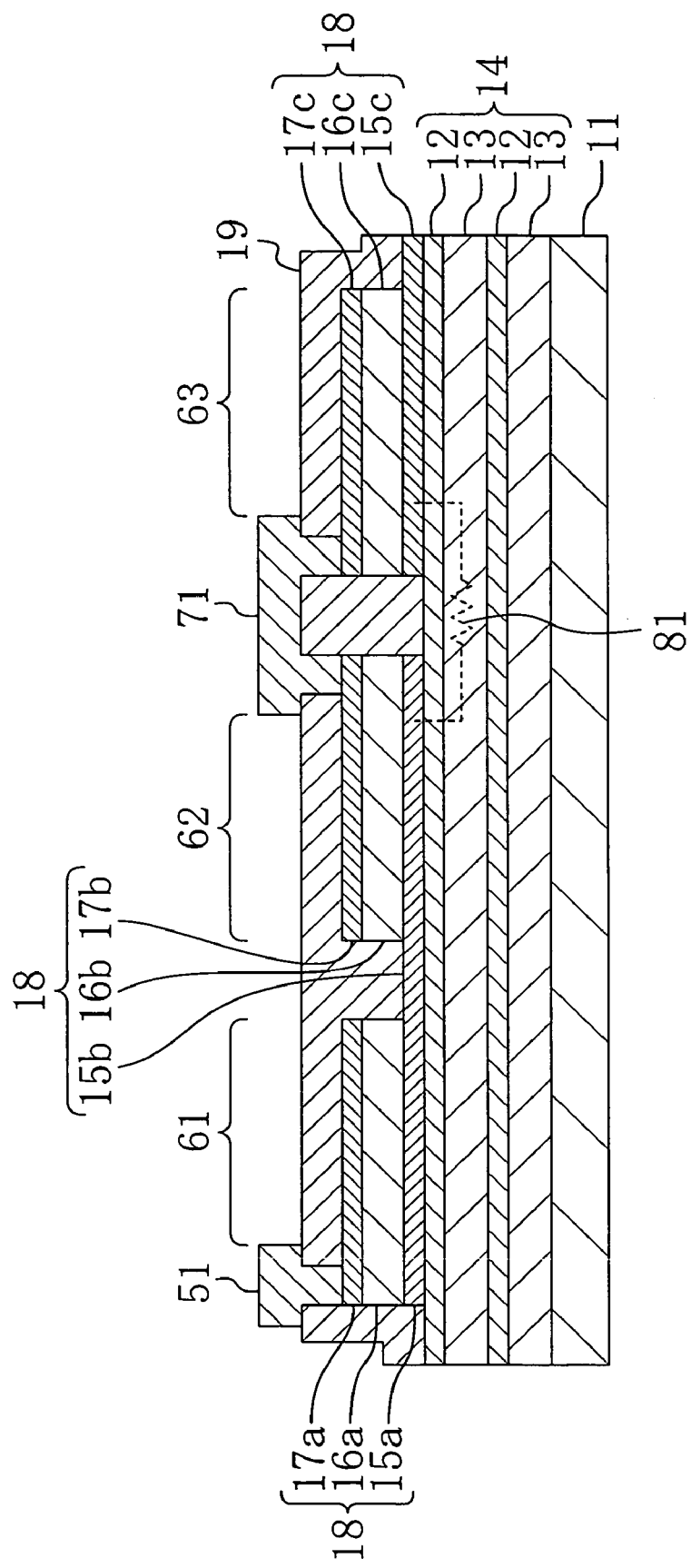
FIG. 14 is a cross-sectional view showing the filter according to the fifth embodiment.

FIG. 14 shows the cross-sectional structure of a main part of the filter element according to the fifth embodiment. As shown in FIG. 14, a plurality of acoustic resonator portions 18 are formed on the substrate 11 with an acoustic reflector portion 14 interpose therebetween.

The acoustic reflector portion 14 is formed of two high acoustic impedance layers 13 made of hafnium oxide and two low acoustic impedance layers 12 made of silicon which are alternately stacked. Each of the acoustic resonator portions 18 is formed of a lower electrode, a piezoelectric film, and an upper electrode which are successively stacked in an ascending order.

Although FIG. 14 shows only the first series bulk acoustic resonator 61, the second series bulk acoustic resonator 62, and the third series bulk acoustic resonator 63, the first parallel bulk acoustic resonator 64 and the second parallel bulk acoustic resonator 65 are also formed similarly on the substrate 11.

The upper surface of the upper electrode 17a of the first series bulk acoustic resonator 61 is connected to the first I/O terminal 51. The lower electrode 15a of the first series bulk acoustic resonator 61 and the lower electrode 15b of the second series bulk acoustic resonator 62 are commonly formed and electrically connected to each other. The upper electrode 17b of the second series bulk acoustic resonator 62 is connected to the upper electrode 17c of the third series bulk acoustic resonator 63 via a wire 71 made of gold or the like.

In order to adjust the resonance frequency, the upper electrode 17a of the first series bulk acoustic resonator 61, the upper electrode 17b of the second series bulk acoustic resonator 62, and the upper electrode 17c of the third series bulk acoustic resonator 63 are covered with a frequency adjusting film 19 formed of an insulting film of silicon oxide, silicon nitride, or the like. It is noted that though the frequency adjusting film 19 formed on each resonator has a uniform film thickness in FIG. 14, the film thickness may vary at each resonators.

The lower electrode 15c of the third series bulk acoustic resonator 63 is extracted and connected to the second I/O terminal 52, though it is not depicted. Each of the lower electrodes 15a and 15b is connected to the lower electrode of the first parallel bulk acoustic resonator 64 and a wire 71 is connected to the upper electrode of the second parallel bulk acoustic resonator 65.

An electric signal inputted from the first I/O terminal 51 is inputted to the upper electrode 17a of the acoustic resonator portion of the first series bulk acoustic resonator 61, passes as an acoustic wave through the piezoelectric film 16a to be transmitted to the lower electrode 15a, and is converted again to the electric signal. Since the lower electrode 15a of the first series bulk acoustic resonator 61 and the lower electrode 15b of the second series bulk acoustic resonator 62 are electrically connected, the electric signal resulting from the conversion is inputted to the second series bulk acoustic resonator 62 and passes as an acoustic wave through the second series bulk acoustic resonators 62. Since the upper electrode 17b of the second series bulk acoustic resonator 62 and the upper electrode 17c of the third series bulk acoustic resonator 63 are connected via the wire 71, the signal that has passed through the second series bulk acoustic resonator 62 transmits as an acoustic wave through the piezoelectric film 16c of the third series bulk acoustic resonator to be transmitted to the lower electrode 15c.

The lower electrode 15b of the second series bulk acoustic resonator 62 and the lower electrode 15c of the third series bulk acoustic resonator 63 are independent of each other so that there is no direct transmission of an electric signal therebetween. However, the lower electrodes 15b and 15c are electrically coupled due to an impedance 81 resulting from capacitance components, resistance components, and the like generated in the individual layers of the acoustic reflector portion 14. As a result, the signal which should originally be propagated from the lower electrode 15b to the piezoelectric film 16b leaks into the lower electrode 15c, which results in a signal loss in the filter element.

Likewise, the second series bulk acoustic resonator 62 and the second parallel bulk acoustic resonator 65 are also electrically coupled due to an impedance 82 and the third series bulk acoustic resonator 63 and the second parallel bulk acoustic resonator 65 are also electrically coupled due to an impedance 83, which causes the signal loss.

Figure 15:
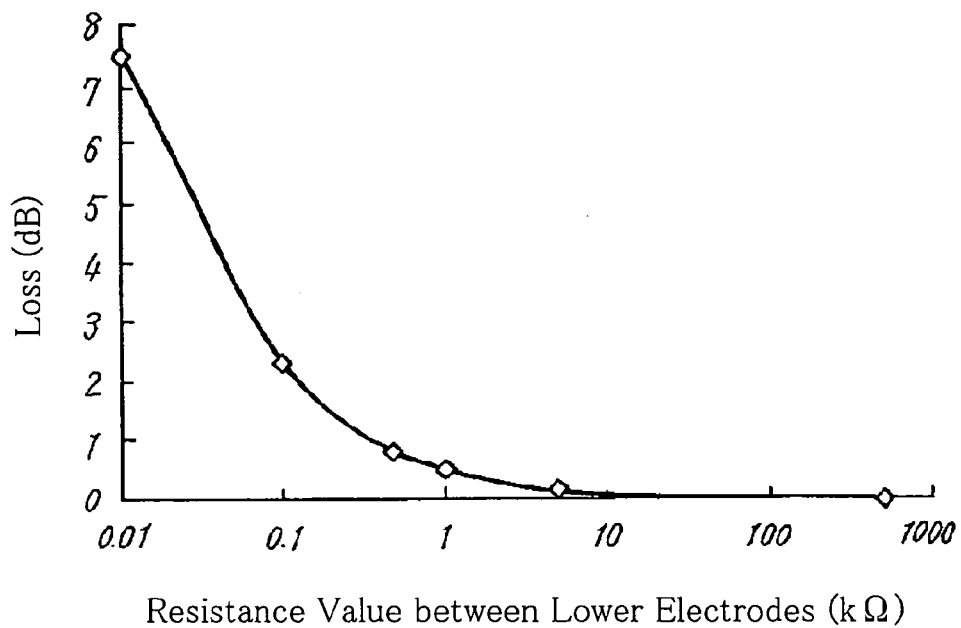
FIG. 15 is a graph showing the correlation between a resistance value between lower electrodes and a signal loss in a filter according to a sixth embodiment of the present invention.

FIG. 15 shows the result of determining the correlation between a resistance value between the lower electrodes 15b and 15c and a signal loss via the acoustic reflector portion 14 by simulation. From FIG. 15, it can be seen that an increase in signal loss from an ideal state where the resistance value between the lower electrodes 15b and 15c is infinite and there is no electrical leakage path component falls within the range of not more than 1 dB when the impedance between the lower electrodes 15b and 15c is not less than 500 Ω. In other words, when the diameter of each of the acoustic resonator portions 18 is 100 μm and the distance between the acoustic resonator portions 18 is 10 μm, the sheet resistance of each of the lower acoustic impedance layers 12 made of silicon with an increased resistance is preferably not less than 5 kΩ/□.

Although the acoustic reflector portion 14 used in the present embodiment has the same structure as used in the bulk acoustic resonator according to the third embodiment, the acoustic reflector portion 14 may also have the structure according to the second embodiment, which uses a metal for the high acoustic impedance layers 13. Alternatively, the acoustic reflector portion 14 may also have a structure as used in the fourth embodiment, which uses an oxide film or the like for a part of the lower acoustic impedance layers 12 and thereby further suppresses electrical coupling between the individual acoustic resonator portions.

Embodiment 6

Figure 16:
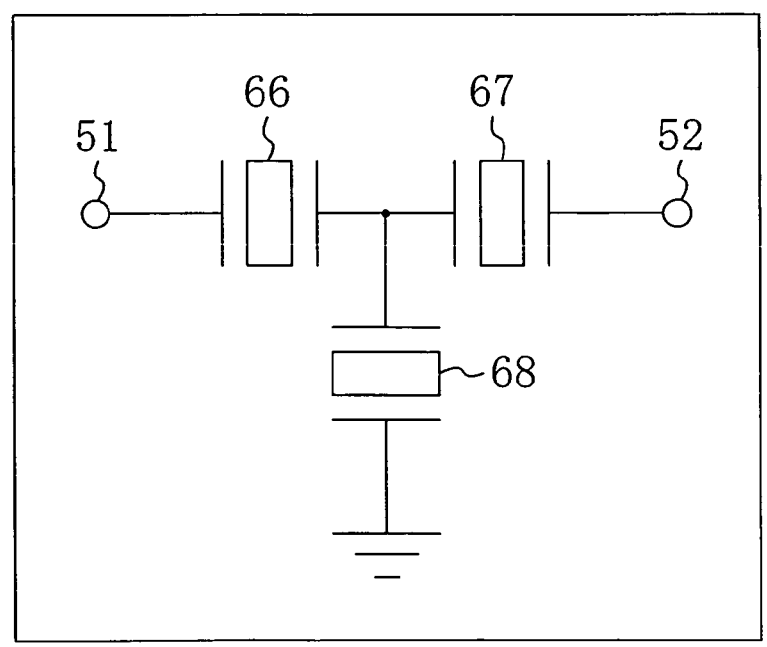
FIG. 16 is an equivalent circuit diagram showing the filter according to the sixth embodiment.

A sixth embodiment of the present invention will be described with reference to the drawings. FIG. 16 shows the circuit structure of a filter element according to the sixth embodiment. The filter element according to the present embodiment comprises: a first series bulk acoustic resonator 66 and a second series bulk acoustic resonator 67 which are connected in series between a first I/O terminal 51 and a second I/O terminal 52; and a parallel bulk acoustic resonator 68 connected between the ground and the connection node between the firs and second series bulk acoustic resonators 66 and 67.

Figure 17:
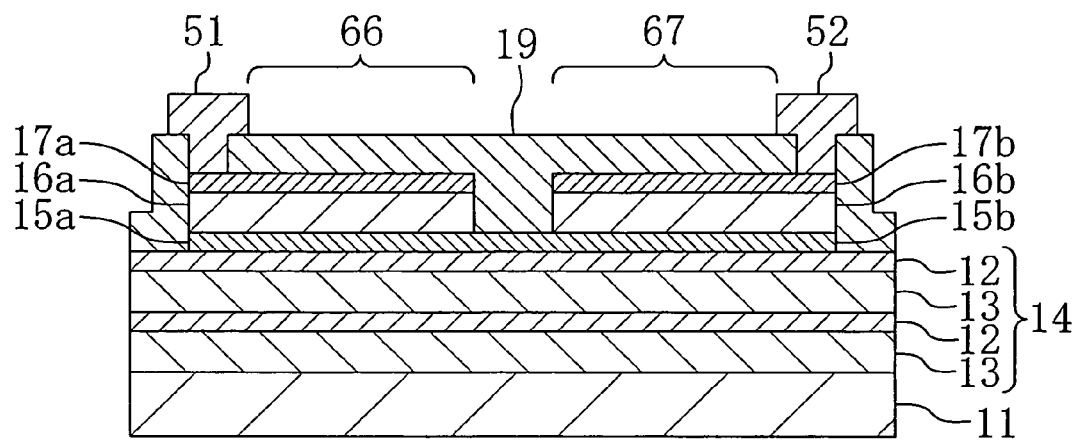
FIG. 17 is a cross-sectional view showing the filter according to the sixth embodiment.

FIG. 17 shows the cross-sectional view of the filter element according to the present embodiment. As shown in FIG. 17, the first and second I/O terminals 51 and 52 are connected to the upper electrode 17a of the first series bulk acoustic resonator 66 and the upper electrode 17b of the second series bulk acoustic resonator 67, respectively. A ground terminal connected to the ground is connected to the upper electrode of the parallel bulk acoustic resonator 68, though it is not depicted. In the arrangement, the respective lower electrodes of the adjacent bulk acoustic resonators are electrically connected so that there is no formation of an electrical leakage path between the individual lower electrodes.

Because the first and second I/O terminals 51 and 52 and the ground terminal are connected to the upper electrodes, a process for extracting wires from the lower electrodes is unnecessary so that an improved yield is expected.

Figure 18:
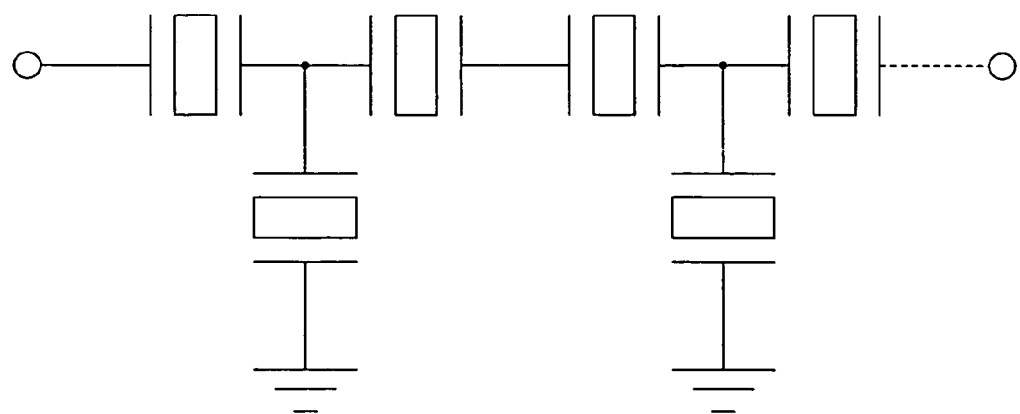
FIG. 18 is an equivalent circuit diagram showing a filter according to a variation of the sixth embodiment.
Figure 19:
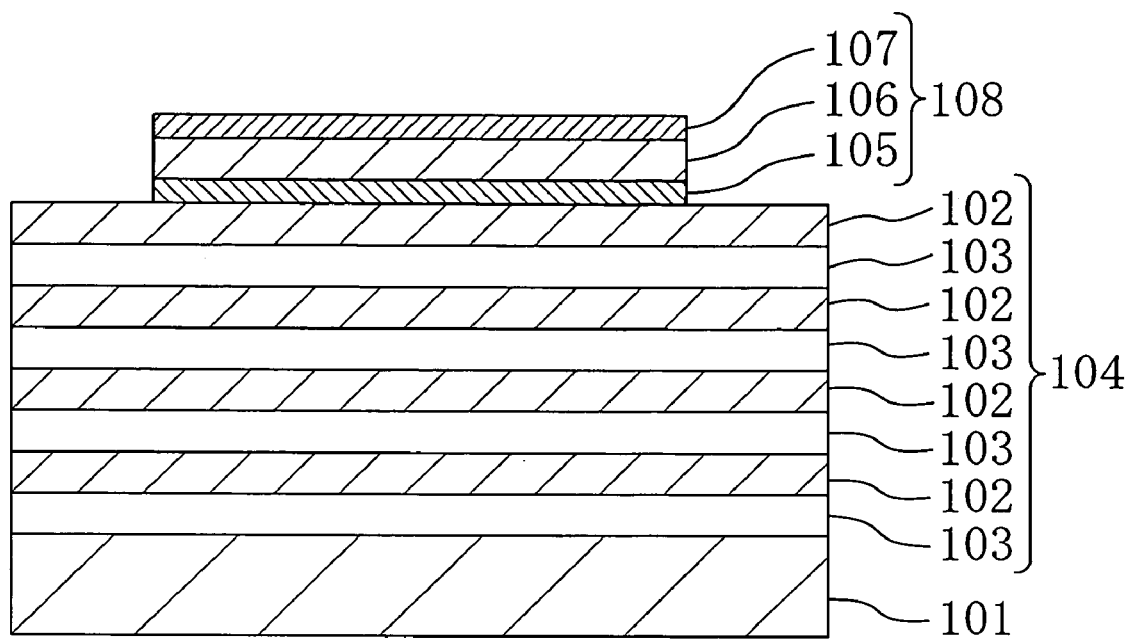
FIG. 19 is a cross-sectional view showing an acoustic resonator according to a conventional embodiment.

By connecting the plurality of filter elements according to the sixth embodiment in series as shown in FIG. 18, a filter element having all the terminals connected to the upper electrodes of the acoustic resonator portions can be formed.

As described above, the bulk acoustic resonator and the filer element using the same according to the present invention can implement a bulk acoustic resonator having the acoustic reflector portion comprised of a small number of stacked layers and are therefore useful as a bulk acoustic resonator and a filter element.

What is claimed is:

1. A bulk acoustic resonator comprising:
   an acoustic reflector portion formed on a substrate and including one or more low acoustic impedance layers and one or more high acoustic impedance layers having a higher acoustic impedance than the low acoustic impedance layer which are disposed in stacked relation; and
   an acoustic resonator portion formed on the acoustic reflector portion and having a piezoelectric film, wherein
   at least one of the low acoustic layers is made of silicon, and
   the high acoustic impedance layer is made of $HfO_{2-x}N_x$ ($0<x<2$).

2. The bulk acoustic resonator of claim 1, wherein at least one of the low acoustic impedance layers made of silicon is doped with an impurity.

3. The bulk acoustic resonator of claim 1, wherein at least one of the low acoustic impedance layers made of silicon is porosified.

4. The bulk acoustic resonator of claim 1, wherein at least one of the low acoustic impedance layers made of silicon is made of amorphous silicon.

5. The bulk acoustic resonator of claim 1, further comprising:
   a first buffer layer formed between the substrate and the acoustic reflector portion.

6. The bulk acoustic resonator of claim 1, further comprising:
   a second buffer layer formed between the acoustic reflector portion and the acoustic resonator portion.

7. The bulk acoustic resonator of claim 6, wherein the second buffer layer is made of aluminum nitride, titanium, ruthenium, or iridium of which a crystal is C-axis oriented.

8. The bulk acoustic resonator of claim 1, wherein an uppermost layer of the acoustic reflector portion is the low acoustic impedance layer made of silicon having portions thereof forming an insulator.

9. A filter element comprising:
   an acoustic reflector portion formed on a substrate and having a low acoustic impedance layer including at least one layer made of silicon and a high acoustic impedance layer having a higher acoustic impedance than the low acoustic impedance layer; and
   a plurality of acoustic resonator portions each formed on the acoustic reflector portion and having a lower electrode, a piezoelectric film, and an upper electrode which are formed successively in an ascending order, wherein
   at least two of said plurality of acoustic resonator portions have the respective lower electrodes independent of each other,
   a resistance value between the independent lower electrodes is not less than 500 Ω, and
   the high acoustic impedance layer is made of $HfO_{2-x}N_x$ ($0<x<2$).

* * * * *

UNITED STATES PATENT AND TRADEMARK OFFICE
CERTIFICATE OF CORRECTION

| | | |
|---|---|---|
| PATENT NO. | : 7,619,493 B2 | Page 1 of 1 |
| APPLICATION NO. | : 11/590804 | |
| DATED | : November 17, 2009 | |
| INVENTOR(S) | : Uno et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 296 days.

Signed and Sealed this

Twenty-sixth Day of October, 2010

David J. Kappos
*Director of the United States Patent and Trademark Office*